(12) United States Patent
El Baraji et al.

(10) Patent No.: US 8,576,615 B2
(45) Date of Patent: *Nov. 5, 2013

(54) MAGNETIC RANDOM ACCESS MEMORY DEVICES INCLUDING MULTI-BIT CELLS

(75) Inventors: Mourad El Baraji, Sunnyvale, CA (US); Neal Berger, Cupertino, CA (US); Lucien Lombard, Grenoble (FR); Lucian Prejbeanu, Seyssinet Pariset (FR); Ricardo Alves Ferreira Costa E Sousa, Grenoble (FR); Guillaume Prenat, Grenoble (FR)

(73) Assignee: Crocus Technology Inc., Sunnyvale, CA (US)

( * ) Notice: Subject to any disclaimer, the term of this patent is extended or adjusted under 35 U.S.C. 154(b) by 217 days.

This patent is subject to a terminal disclaimer.

(21) Appl. No.: 13/158,312

(22) Filed: Jun. 10, 2011

(65) Prior Publication Data

US 2012/0314487 A1 Dec. 13, 2012

(51) Int. Cl.
  *G11C 11/46* (2006.01)
(52) U.S. Cl.
  USPC .......................................... 365/158; 365/173
(58) Field of Classification Search
  USPC ..................................... 365/55, 66
  See application file for complete search history.

(56) References Cited

U.S. PATENT DOCUMENTS

| | | |
|---|---|---|
| 5,917,749 A | 6/1999 | Chen et al. |
| 5,959,880 A | 9/1999 | Shi et al. |
| 5,982,660 A | 11/1999 | Bhattacharyya et al. |
| 6,545,906 B1 | 4/2003 | Savtchenko et al. |
| 6,577,529 B1 | 6/2003 | Sharma et al. |
| 6,657,889 B1 | 12/2003 | Subramanian et al. |
| 6,714,442 B1 | 3/2004 | Nahas |
| 6,794,697 B1 | 9/2004 | Sharma |
| 6,937,497 B1 | 8/2005 | Ju et al. |
| 6,956,764 B2 * | 10/2005 | Engel et al. .................... 365/158 |

(Continued)

FOREIGN PATENT DOCUMENTS

| | | |
|---|---|---|
| EP | 2355142 A1 | 10/2011 |
| KR | 10/2009/011203 A | 10/2009 |
| WO | 2010/064476 A1 | 6/2010 |

OTHER PUBLICATIONS

Bland, "Shape Anisotropy", Mar. 15, 2003, retrieved on Jul. 29, 2012 from the Internet: <URL: http://www.cmp.liv.ac.uk/frink/thesis/thesis/node67.html>, 4 pgs.

(Continued)

*Primary Examiner* — Tan T. Nguyen
(74) *Attorney, Agent, or Firm* — Cooley LLP

(57) ABSTRACT

A magnetic random access memory ("MRAM") cell includes: (1) a first magnetic layer having a first magnetization direction and a magnetic anisotropy axis; (2) a second magnetic layer having a second magnetization direction; and (3) a spacer layer disposed between the first magnetic layer and the second magnetic layer. The MRAM cell also includes a field line magnetically coupled to the MRAM cell and configured to induce a write magnetic field along a magnetic field axis, and the magnetic anisotropy axis is tilted relative to the magnetic field axis. During a write operation, the first magnetization direction is switchable between m directions to store data corresponding to one of m logic states, with m>2, at least one of the m directions is aligned relative to the magnetic anisotropy axis, and at least another one of the m directions is aligned relative to the magnetic field axis.

20 Claims, 6 Drawing Sheets

(56) References Cited

U.S. PATENT DOCUMENTS

| | | | |
|---|---|---|---|
| 7,075,818 B2* | 7/2006 | Ju | 365/158 |
| 7,133,309 B2 | 11/2006 | Gaidis et al. | |
| 7,173,848 B2* | 2/2007 | Ju | 365/173 |
| 7,190,611 B2 | 3/2007 | Nguyen et al. | |
| 7,336,528 B2* | 2/2008 | Lim | 365/171 |
| 7,502,248 B2 | 3/2009 | Lim | |
| 7,566,507 B2 | 7/2009 | Abarra et al. | |
| 7,570,463 B2 | 8/2009 | Parkin | |
| 7,706,176 B2 | 4/2010 | Dittrich | |
| 7,742,333 B2 | 6/2010 | Lee et al. | |
| 7,764,454 B2 | 7/2010 | Roshchin et al. | |
| 7,894,249 B2* | 2/2011 | Nebashi et al. | 365/158 |
| 7,898,853 B2 | 3/2011 | Lee et al. | |
| 7,939,816 B2 | 5/2011 | Lee | |
| 7,952,914 B2 | 5/2011 | Baek et al. | |
| 8,004,883 B2 | 8/2011 | Zheng et al. | |
| 8,018,011 B2 | 9/2011 | Ranjan et al. | |
| 8,058,696 B2 | 11/2011 | Ranjan et al. | |
| 8,081,501 B2 | 12/2011 | Choi et al. | |
| 2006/0028774 A1 | 2/2006 | Katti | |
| 2008/0180989 A1 | 7/2008 | Baek et al. | |
| 2008/0247072 A1 | 10/2008 | Nozieres | |
| 2009/0027948 A1 | 1/2009 | Ruehrig | |
| 2009/0073755 A1 | 3/2009 | Katti | |
| 2011/0002151 A1 | 1/2011 | Javerliac et al. | |
| 2012/0120718 A1 | 5/2012 | Lou et al. | |
| 2012/0155164 A1 | 6/2012 | Shukh | |
| 2012/0201073 A1 | 8/2012 | Berger et al. | |
| 2012/0201074 A1 | 8/2012 | Berger et al. | |
| 2012/0314488 A1 | 12/2012 | El Baraji et al. | |

OTHER PUBLICATIONS

"International Search Report and Written Opinion" issued to International Patent Application No. PCT/US2012/041556, Aug. 16, 2012, 9 pgs.

Sebastian et al., "All Optical Investigation of the Shape Anisotropy of Individual Micron Sized Ni80Fe20 Elements", AG Magnetismus Tu Kaiserslautern, 2010, retrieved Jul. 29, 2012 from the internet: <URL: http://www.physik.uni-kl.de/fileadmis/hillebrands/Jahresberichte/Annual_report_2010/AR2010-Chapter4-19.pdf>, pp. 124-128.

"International Search Report and Written Opinion" issued to International Patent Application No. PCT/2012/023682, Aug. 29, 2012, 8 pgs.

International Search Report and Written Opinion, issued to International Patent Application No. PCT/US2012/041562, Aug. 24, 2012, 8 pgs.

Nonfinal Office Action, issued to U.S. Appl. No. 13/023,442, Sep. 26, 2012, 7 pgs.

Nonfinal Office Action, issued to U.S. Appl. No. 13/158,316, Nov. 8, 2012, 7 pgs.

Berger et al. U.S. Appl. No. 13/023,442, filed Feb. 8, 2011 for "Magnetic Random Access Memory Devices Configured for Self-Referenced Read Operation.".

Notice of Allowance issued to U.S. Appl. No. 13/158,316, Mar. 1, 2013, 8 pgs.

* cited by examiner

MAGNETIC RANDOM ACCESS MEMORY DEVICES INCLUDING MULTI-BIT CELLS

FIELD OF THE INVENTION

The invention relates generally to magnetic random access memory ("MRAM") devices. More particularly, the invention relates to MRAM devices including multi-bit cells.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each of which is implemented as a single-bit cell to store a binary data value. Specifically, each MRAM cell includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, such as by applying a magnetic field. When the respective magnetizations of the reference layer and the storage layer are antiparallel, a resistance of the magnetic tunnel junction is high, namely having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which represents an in-between resistance value between that of the high logic state "1" and the low logic state "0".

While a conventional MRAM device offers a number of benefits, it would be desirable to increase a storage density beyond that provided by an array of single-bit cells. Specifically, it would be desirable to increase the storage density, while balancing other considerations related to power consumption and manufacturing costs.

It is against this background that a need arose to develop the MRAM devices and related methods described herein.

SUMMARY

One aspect of the invention relates to a memory device. In one embodiment, the memory device includes at least one MRAM cell, which includes: (1) a first magnetic layer having a first magnetization direction and a magnetic anisotropy axis; (2) a second magnetic layer having a second magnetization direction; and (3) a spacer layer disposed between the first magnetic layer and the second magnetic layer. The MRAM cell also includes a field line magnetically coupled to the MRAM cell and configured to induce a write magnetic field along a magnetic field axis, and the magnetic anisotropy axis is tilted relative to the magnetic field axis. During a write operation, the first magnetization direction is switchable between m directions to store data corresponding to one of m logic states, with m>2, at least one of the m directions is aligned relative to the magnetic anisotropy axis, and at least another one of the m directions is aligned relative to the magnetic field axis.

Another aspect of the invention relates to a method of operating a memory device. In one embodiment, the method includes: (1) providing a MRAM cell having a storage magnetization direction and a magnetic anisotropy axis, wherein the storage magnetization direction is pinned relative to a threshold temperature; (2) during a write operation, heating the MRAM cell above the threshold temperature, such that the storage magnetization direction is temporarily unpinned prior to cooling of the MRAM cell below the threshold temperature; and (3) during the write operation and while the storage magnetization direction remains unpinned, (a) inducing a write magnetic field along a magnetic field axis, such that the storage magnetization direction is aligned relative to the magnetic field axis; and (b) deactivating the write magnetic field, such that the storage magnetization direction is aligned relative to the magnetic anisotropy axis, wherein the magnetic anisotropy axis is tilted at an angle θ relative to the magnetic field axis, with 0°<θ<90°.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like features, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be coupled to one another or can be formed integrally with one another.

As used herein, the terms "couple," "coupled," and "coupling" refer to an operational connection or linking. Coupled objects can be directly connected to one another or can be indirectly connected to one another, such as via another set of objects.

As used herein, the term "aspect ratio" refers to a ratio of a longest dimension or extent of an object and a remaining dimension or extent of the object, where the remaining dimension is orthogonal relative to the longest dimension. For example, an aspect ratio of an ellipse refers to a ratio of a major axis and a minor axis of the ellipse.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

MRAM Devices

Figure 1:
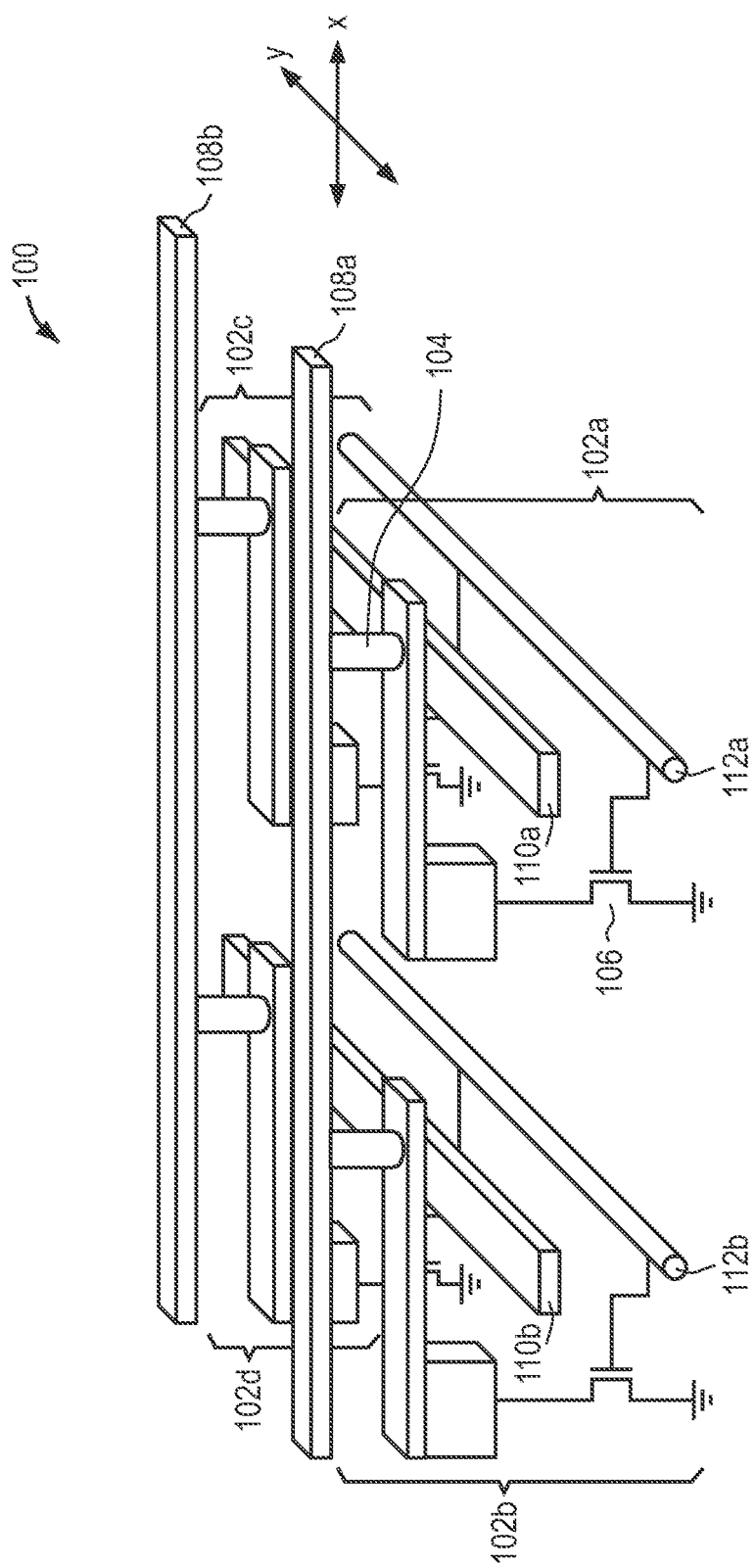
FIG. 1 illustrates a MRAM device implemented in accordance with an embodiment of the invention.

Attention first turns to FIG. 1, which is a perspective view of a memory device implemented in accordance with an embodiment of the invention. In the illustrated embodiment, the memory device is a MRAM device 100 that includes a set of MRAM cells 102a, 102b, 102c, and 102d. Each of the MRAM cells 102a, 102b, 102c, and 102d includes a magnetic tunnel junction and a selection transistor, such as a magnetic tunnel junction 104 and a selection transistor 106 included in the MRAM cell 102a. Referring to FIG. 1, the MRAM cells 102a, 102b, 102c, and 102d are arranged in rows and columns along substantially orthogonal directions of a square or rectangular array, although other two-dimensional and three-dimensional arrays are contemplated. Also, while the four MRAM cells 102a, 102b, 102c, and 102d are illustrated in FIG. 1, it is contemplated that more or less MRAM cells can be included in the MRAM device 100.

In the illustrated embodiment, each of the MRAM cells 102a, 102b, 102c, and 102d is implemented to store data corresponding to any of three or more logic states. In other words, each of the MRAM cells 102a, 102b, 102c, and 102d is a multi-bit cell that stores a multi-bit data value. The implementation of such multi-bit cells increases a storage density of the MRAM device 100, relative to an implementation with single-bit or binary cells. As further explained below, each of the MRAM cells 102a, 102b, 102c, and 102d is characterized by a magnetic anisotropy, which imparts a preferred set of magnetization directions according to a magnetic anisotropy axis. By leveraging the magnetic anisotropy of the MRAM cells 102a, 102b, 102c, and 102d, three or more logic states can be encoded per MRAM cell, while balancing considerations related to power consumption and manufacturing costs. It is also contemplated that certain ones of the MRAM cells 102a, 102b, 102c, and 102d can be implemented as multi-bit cells, while other ones of the MRAM cells 102a, 102b, 102c, and 102d can be implemented as single-bit cells.

Referring to FIG. 1, the MRAM device 100 includes a set of traces or strip conductors to provide write and read functionality. Specifically, a set of field lines 110a and 110b extend across the array of the MRAM cells 102a, 102b, 102c, and 102d in a substantially parallel fashion relative to one another, with the field line 110a magnetically coupled to the MRAM cells 102a and 102c along one column of the array, and with the field line 110b magnetically coupled to the MRAM cells 102b and 102d along another column of the array. During write operations, the application of currents through the field lines 110a and 110b induces magnetic fields that can vary one set of magnetizations of the MRAM cells 102a, 102b, 102c, and 102d, namely storage magnetizations of respective ones of the MRAM cells 102a, 102b, 102c, and 102d. In the illustrated embodiment, the field lines 110a and 110b extend along a field line axis, namely the y-axis, and the application of currents through the field lines 110a and 110b induces magnetic fields that are oriented along a magnetic field axis, namely the x-axis, which is substantially orthogonal relative to the field line axis. As further explained below, a magnetic anisotropy axis of each of the MRAM cells 102a, 102b, 102c, and 102d is rotated or tilted relative to the magnetic field axis, such that three or more logic states can be encoded per MRAM cell using no more than a pair of magnetic field directions induced by a single field line 110a or 110b. The implementation of a single field line 110a or 110b to encode three or more logic states per MRAM cell reduces power consumption during write operations, conserves valuable die area, and lowers manufacturing costs, relative to an implementation using multiple field lines per MRAM cell.

The MRAM device 100 also includes a set of bit lines 108a and 108b, which extend across the array in a substantially parallel fashion relative to one another and in a substantially orthogonal fashion relative to the field lines 110a and 110b. Specifically, the bit line 108a is electrically coupled to the MRAM cells 102a and 102b along one row of the array, and the bit line 108b is electrically coupled to the MRAM cells 102c and 102d along another row of the array. In the illustrated embodiment, the MRAM cells 102a, 102b, 102c, and 102d are implemented for thermally assisted switching ("TAS"), and, during write operations, the application of currents through the bit lines 108a and 108b and through the MRAM cells 102a, 102b, 102c, and 102d results in heating that allows the storage magnetizations of the MRAM cells 102a, 102b, 102c, and 102d to be varied. During read operations, the application of currents through the bit lines 108a and 108b and through the MRAM cells 102a, 102b, 102c, and 102d allows the determination of resistance values, which are indicative of a degree of alignment between the storage magnetizations and another set of magnetizations of the MRAM cells 102a, 102b, 102c, and 102d, namely reference magnetizations of respective ones of the MRAM cells 102a, 102b, 102c, and 102d.

Still referring to FIG. 1, the MRAM device 100 further includes a set of control lines 112a and 112b, which are electrically coupled to the MRAM cells 102a, 102b, 102c, and 102d through their selection transistors. Specifically, the control line 112a is electrically coupled to the selection transistors of the MRAM cells 102a and 102c along one column of the array, and the control line 112b is electrically coupled to the selection transistors of the MRAM cells 102b and 102d along another column of the array. During write and read operations, the control lines 112a and 112b switch the selection transistors between a blocked mode (OFF) and a saturated mode (ON). Coordinated operation of the field lines 110a and 110b, the bit lines 108a and 108b, and the control lines 112a or 112b allows a particular subset of the MRAM cells 102a, 102b, 102c, and 102d to be selectively addressed during write and read operations. For example, when the MRAM cell 102a is to be written, the field line 110a and the bit line 108a can be activated, and the control line 112a also can be activated to switch the selection transistor 106 to a saturated mode, thereby inducing a magnetic field in the vicinity of the MRAM cell 102a and allowing the flow of a current through the MRAM cell 102a. In such manner, the MRAM cell 102a, which is disposed at an intersection of the field line 110a, the bit line 108a, and the control line 112a, can be individually addressed.

Other implementations of the field lines 110a and 110b, the bit lines 108a and 108b, and the control lines 112a or 112b are contemplated. Specifically, the orientation and the number of these traces can be varied from that illustrated in FIG. 1. For example, the field lines 110a and 110b can be combined into a common field line that is magnetically coupled to, and shared by, the MRAM cells 102a and 102c and the MRAM cells 102b and 102d in different columns. As another example, the application of currents through the bit lines 108a and 108b can be used to induce magnetic fields to vary the storage magnetizations of the MRAM cells 102a, 102b, 102c, and 102d during write operations. In other words, the bit lines 108a and 108b also can function as a set of field lines, such that the field lines 110a and 110b can be omitted. The implementation of such dual-function bit/field lines further conserves valuable die area and further lowers manufacturing costs. Also, because of the close spacing of such dual-function bit/field lines relative to the MRAM cells 102a, 102b, 102c, and 102d, switching efficiency of induced magnetic fields can be improved, thereby allowing low-intensity magnetic fields and reduced power consumption. As a further example and as explained below with reference to FIG. 6, the field lines 110a and 110b can be disposed above the bit lines 108a and 108b, rather than below the bit lines 108a and 108b as illustrated in FIG. 1

Figure 2:
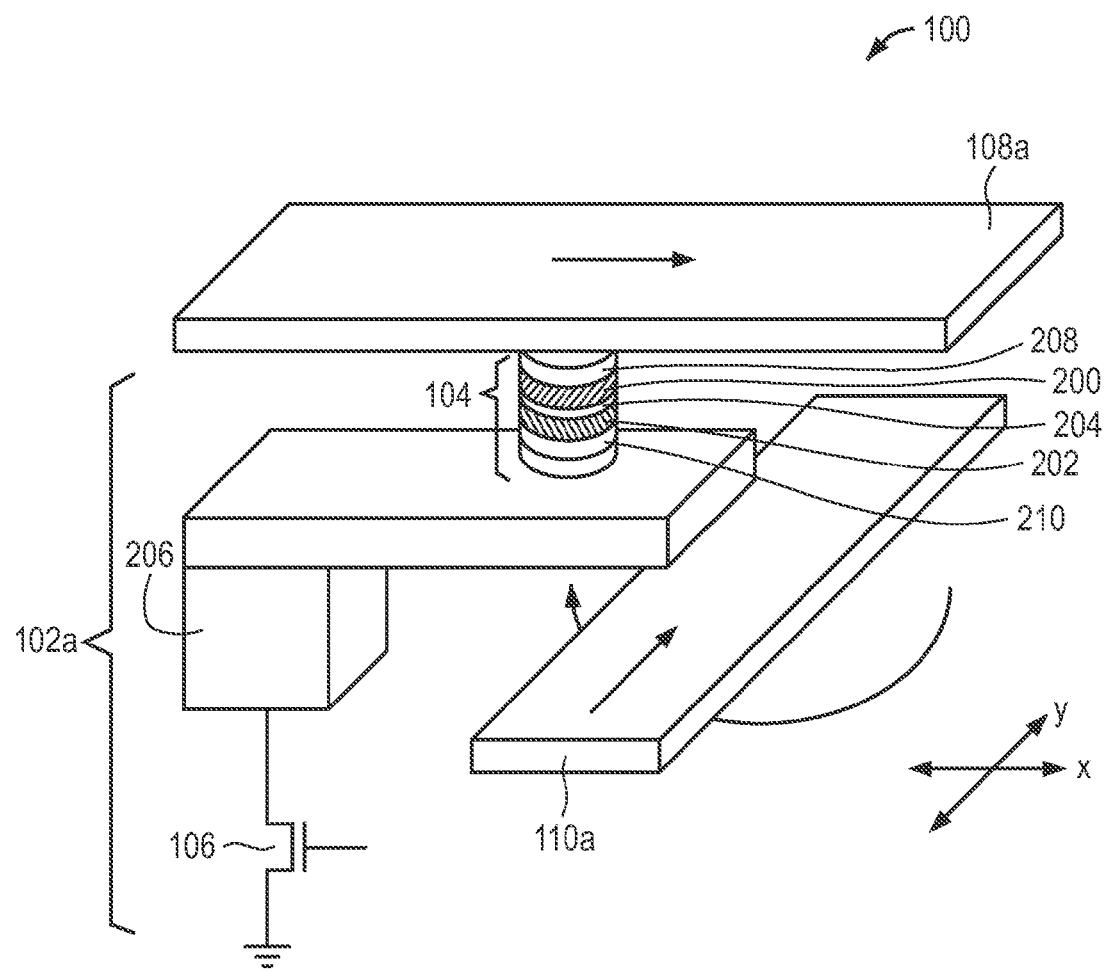
FIG. 2 illustrates a MRAM cell included in the MRAM device of FIG. 1, according to an embodiment of the invention.

Attention next turns to FIG. 2, which is an enlarged view of the MRAM cell 102a that is included in the MRAM device 100 of FIG. 1, according to an embodiment of the invention. The MRAM cell 102a includes the magnetic tunnel junction 104, which includes a pair of magnetic layers corresponding to a storage layer 200 and a reference layer 202. The magnetic tunnel junction 104 also includes a spacer layer 204 that is disposed between the storage layer 200 and the reference layer 202. As illustrated in FIG. 2, the bit line 108a is electrically coupled to the magnetic tunnel junction 104 on the side of the storage layer 200 and is substantially orthogonal to the field line 110a, which is disposed below and magnetically coupled to the magnetic tunnel junction 104 on the side of the reference layer 202. The MRAM cell 102a also includes the selection transistor 106, which is electrically coupled, through a strap 206, to the magnetic tunnel junction 104 on the side of the reference layer 202. Other implementations of the MRAM cell 102a are contemplated. For example, the relative positioning of the storage layer 200 and the reference layer 202 can be reversed in the magnetic tunnel junction 104, with the reference layer 202 disposed above the storage layer 200.

Each of the storage layer 200 and the reference layer 202 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In the illustrated embodiment, at least the storage layer 200 includes a ferromagnetic material having a magnetic anisotropy, which can derive from shape anisotropy, intrinsic anisotropy, or both. In general, the storage layer 200 and the reference layer 202 can include the same ferromagnetic material or different ferromagnetic materials. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the storage layer 200 and the reference layer 202 can be in the nanometer ("nm") range, such as from about 1 nm to about 20 nm or from about 1 nm to about 10 nm. Other implementations of the storage layer 200 and the reference layer 202 are contemplated. For example, either, or both, of the storage layer 200 and the reference layer 202 can include multiple sub-layers in a fashion similar to that of the so-called synthetic antiferromagnetic layer.

In the illustrated embodiment, the MRAM cell 102a is implemented as a multi-bit cell that stores a multi-bit data value. In accordance with the multi-bit implementation of the MRAM cell 102a, the storage layer 200 has a storage magnetization direction that is switchable between m directions corresponding to m logic states, with m>2.

The spacer layer 204 functions as a tunnel barrier and includes, or is formed of, an insulating material. Suitable insulating materials include oxides, such as aluminum oxide (e.g., $Al_2O_3$) and magnesium oxide (e.g., MgO). A thickness of the spacer layer 204 can be in the nm range, such as from about 1 nm to about 10 nm.

Referring to FIG. 2, the magnetic tunnel junction 104 also includes a pinning layer 208, which is disposed adjacent to the storage layer 200 and is characterized by a threshold temperature $T_{BS}$, and another pinning layer 210, which is disposed adjacent to the reference layer 202 and is characterized by a threshold temperature $T_{BR}$, with $T_{BR}>T_{BS}$. Each of the threshold temperatures $T_{BS}$ and $T_{BR}$ can correspond to a blocking temperature, a Neel temperature, or another threshold temperature. Through exchange bias, the pinning layer 208 stabilizes the storage magnetization along a particular one of the m directions when a temperature within, or in the vicinity of, the pinning layer 208 is lower than the threshold temperature $T_{BS}$. The pinning layer 208 unpins, or decouples, the storage magnetization when the temperature is above the threshold temperature $T_{BS}$, thereby allowing the storage magnetization to be switched to another one of the m directions. Likewise and through exchange bias, the pinning layer 210 stabilizes the reference magnetization along a substantially fixed direction at temperatures lower than the threshold temperature $T_{BR}$.

Each of the pinning layers 208 and 210 includes, or is formed of, a magnetic material and, in particular, a magnetic material of the antiferromagnetic type. Suitable antiferromagnetic materials include transition metals and their alloys, including alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). For example, the pinning layer 208 can be formed of an alloy based on Ir and Mn (or based on Fe and Mn) with the threshold temperature $T_{BS}$ in the range of about 120° C. to about 220° C. or about 150° C. to about 200° C., and the pinning layer 210 can be formed of an alloy based on Pt and Mn (or based on Ni and Mn) with the threshold temperature $T_{BR}$ in the range of about 300° C. to about 350° C.

During a TAS-type write operation of the MRAM cell 102a, the magnetic tunnel junction 104 is heated by applying a heating current through the magnetic tunnel junction 104 via the bit line 108a, with the selection transistor 106 in a saturated mode. The magnetic tunnel junction 104 is heated to a temperature above the threshold temperature $T_{BS}$ (but below $T_{BR}$), such that the storage magnetization direction is unpinned. Simultaneously or after a short time delay, the field line 110a is activated to induce a write magnetic field to switch the storage magnetization direction from an initial one of m directions to another one of the m directions. Specifically, a write current is applied through the field line 110a to induce the write magnetic field to switch the storage magnetization direction accordingly.

Figure 3A:
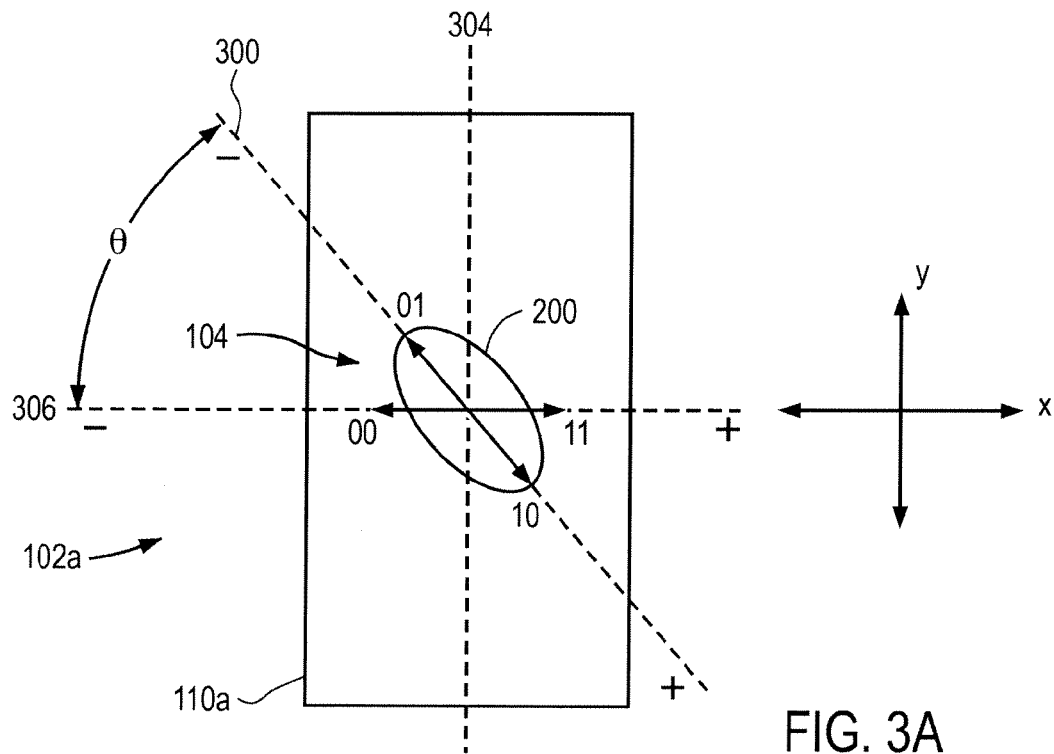
FIG. 3A and FIG. 3B are cross-sectional views of two implementations of a magnetic tunnel junction, according to an embodiment of the invention.
Figure 3B:
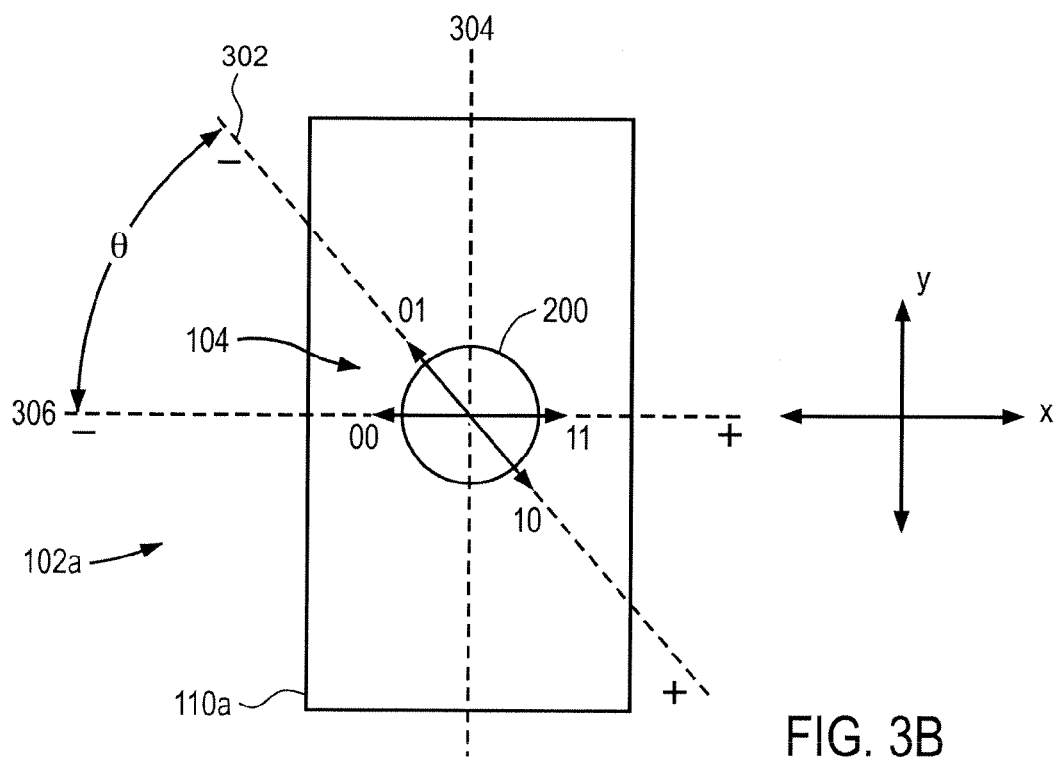

Write operations of the MRAM cell 102a can be further understood with reference to FIG. 3A and FIG. 3B, which are cross-sectional views of two implementations of the magnetic tunnel junction 104 as projected along a plane (here, the x-y plane) in which the storage magnetization direction is switchable, according to an embodiment of the invention. Specifically, FIG. 3A illustrates a rotationally asymmetric implementation of the magnetic tunnel junction 104 (as projected along the x-y plane) in which the storage layer 200 has a magnetic anisotropy axis 300 derived from shape anisotropy, while FIG. 3B illustrates a rotationally symmetric implementation of the magnetic tunnel junction 104 (as projected along the x-y plane) in which the storage layer 200 has a magnetic anisotropy axis 302 derived from intrinsic anisotropy. Other implementations of the storage layer 200 are contemplated, such as one having multiple anisotropy axes.

Referring first to FIG. 3A, a cross-sectional shape of the storage layer 200 is substantially elliptical, with the magnetic anisotropy axis 300 (or easy axis) corresponding to a longest dimension axis (or a major axis) of the storage layer 200 and imparting a pair of energetically favorable directions along the easy axis, and with a hard axis corresponding to a shortest dimension axis (or a minor axis) of the storage layer 200 and imparting a pair of energetically unfavorable directions along the hard axis. The elliptical shape of the storage layer 200 can be achieved through a suitable patterning technique during manufacturing, such as photolithography. Other cross-sectional shapes are contemplated for the storage layer 200, including other elongated shapes, such as a substantially rectangular shape, and other shapes having an aspect ratio greater than 1, such as at least about 1.1, at least about 1.5, or at least about 2.

In the case of FIG. 3B, a cross-sectional shape of the storage layer 200 is substantially circular, with the magnetic anisotropy axis 302 (or easy axis) derived from intrinsic anisotropy and imparting a pair of energetically favorable directions along the easy axis. Intrinsic anisotropy of the storage layer 200 can be achieved through intrinsic material characteristics, such as magnetocrystalline anisotropy in which an atomic structure or orientation of a crystal imparts a directional dependence for magnetization; anisotropy introduced during manufacturing, such as annealing in the presence of a magnetic field; or a combination of material characteristics and manufacturing conditions.

Referring to FIG. 3A and FIG. 3B, the field line 110a extends along a field line axis 304 (here, the y-axis), and the application of a current through the field line 110a induces a magnetic field that is oriented along a magnetic field axis 306 (here, the x-axis). As illustrated in FIG. 3A and FIG. 3B, the magnetic anisotropy axis 300 or 302 is tilted at an angle θ relative to the magnetic field axis 306, and is tilted at an angle (90°–θ) relative to the field line axis 304, with 0°<θ<90°, such as 10°≤θ≤80°, 20°≤θ≤70°, 30°≤θ≤60°, 35°≤θ≤55°, or θ≈45°. By implementing such tilting, m logic states can be encoded according to m distinct directions, with at least one of the m directions aligned along the magnetic anisotropy axis 300 or 302, and with at least another one of the m directions aligned along the magnetic field axis 306.

For certain implementations, m is represented as $m=2^n$, with n≥2. Here, the MRAM cell 102a is an n-bit cell that stores an n-bit data value. In the case that m=4 and n=2, one possible write encoding scheme assigning four logic states to four distinct directions is illustrated in FIG. 3A and FIG. 3B. Specifically, the logic state "00" is assigned to a "negative" direction along the magnetic field axis 306, the logic state "01" is assigned to a "negative" direction along the magnetic anisotropy axis 300 or 302, the logic state "10" is assigned to a "positive" direction along the magnetic anisotropy axis 300 or 302, and the logic state "11" is assigned to a "positive" direction along the magnetic field axis 306. It should be understood that other write encoding schemes are contemplated. For example, the assignment between m logic states and m directions can be permuted, such that the logic state "00" is assigned to the "positive" direction along the magnetic field axis 306, the logic state "01" is assigned to the "positive" direction along the magnetic anisotropy axis 300 or 302, and so forth. As another example, certain of the m logic states and certain of the m distinct directions can be omitted.

FIG. 4A through FIG. 4D illustrate a sequence of write operations for the elliptical implementation of FIG. 3A, according to an embodiment of the invention. Here, $H_x$ represents the x-component of a write magnetic field as projected along the x-y plane. It should be understood that a similar sequence of write operations can be carried out for the circular implementation of FIG. 3B.

Figure 4A:
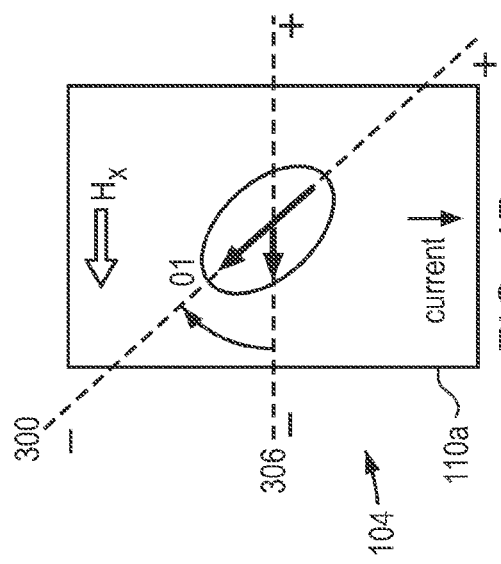
FIG. 4A through FIG. 4D illustrate a sequence of write operations for the implementation of FIG. 3A, according to an embodiment of the invention.
Figure 4B:
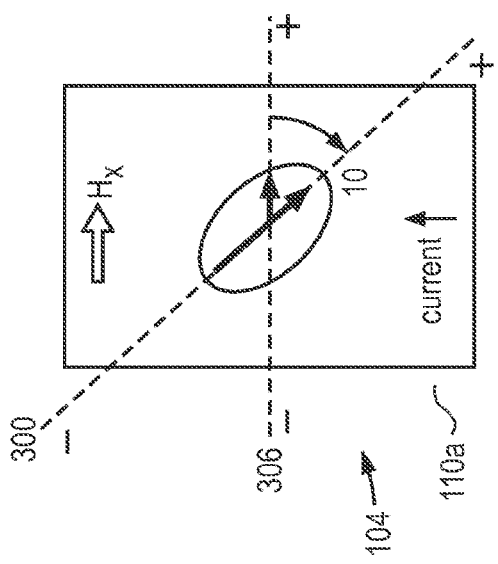

Referring to FIG. 4A and FIG. 4B, the bit line 108a (illustrated in FIG. 1 and FIG. 2) applies a heating current that heats the magnetic tunnel junction 104 above the threshold temperature $T_{BS}$, such that the storage magnetization direction is temporarily unpinned. In addition, the field line 110a applies a write current that induces the write magnetic field $H_x$, which is oriented along the magnetic field axis 306 in a "negative" direction. Once the storage magnetization direction is switched according to the write magnetic field $H_x$, the selection transistor 106 (illustrated in FIG. 1 and FIG. 2) is switched to a blocked mode to inhibit current flow through the magnetic tunnel junction 104, thereby cooling the magnetic tunnel junction 104 below the threshold temperature $T_{BS}$. In the case of FIG. 4A, the write magnetic field $H_x$ is maintained during cooling of the magnetic tunnel junction 104, and is deactivated once the magnetic tunnel junction 104 has cooled below the threshold temperature $T_{BS}$. In such manner, the storage magnetization direction is switched and retained along the magnetic field axis 306 in the "negative" direction.

In the case of FIG. 4B, the write magnetic field $H_x$ is deactivated prior to cooling of the magnetic tunnel junction 104 below the threshold temperature $T_{BS}$ and while the storage magnetization direction remains unpinned. As a result of magnetic anisotropy, the storage magnetization direction rotates towards the magnetic anisotropy axis 300 and is retained in such an orientation once the magnetic tunnel junction 104 has cooled below the threshold temperature $T_{BS}$. In such manner, the storage magnetization direction is switched and retained along the magnetic anisotropy axis 300 in a "negative" direction.

Figure 4C:
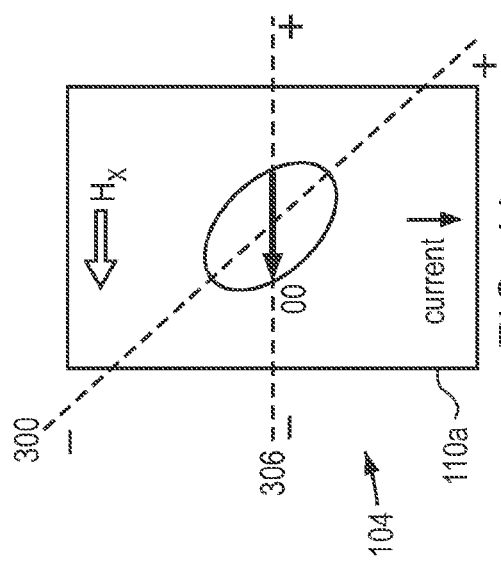
Figure 4D:
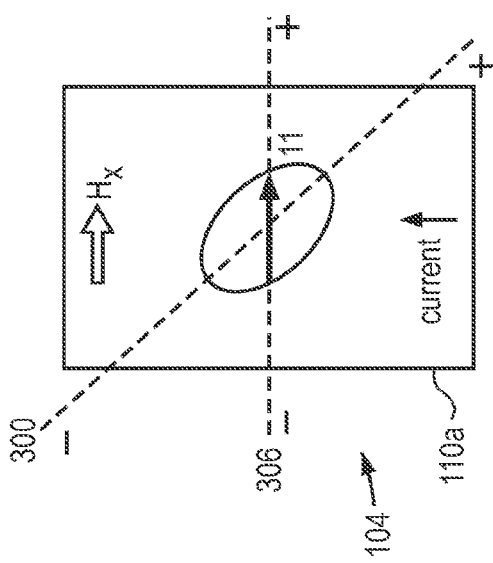

Referring next to FIG. 4C and FIG. 4D, the bit line 108a (illustrated in FIG. 1 and FIG. 2) applies a heating current that heats the magnetic tunnel junction 104 above the threshold temperature $T_{BS}$, such that the storage magnetization direction is temporarily unpinned. In addition, the field line 110a applies a write current that induces the write magnetic field $H_x$, which is oriented along the magnetic field axis 306 in a "positive" direction. Once the storage magnetization direction is switched according to the write magnetic field $H_x$, the selection transistor 106 (illustrated in FIG. 1 and FIG. 2) is switched to a blocked mode to inhibit current flow through the magnetic tunnel junction 104, thereby cooling the magnetic tunnel junction 104 below the threshold temperature $T_{BS}$. In the case of FIG. 4C, the write magnetic field $H_x$ is maintained during cooling of the magnetic tunnel junction 104, and is deactivated once the magnetic tunnel junction 104 has cooled below the threshold temperature $T_{BS}$. In such manner, the storage magnetization direction is switched and retained along the magnetic field axis 306 in the "positive" direction. In the case of FIG. 4D, the write magnetic field $H_x$ is deactivated prior to cooling of the magnetic tunnel junction 104 below the threshold temperature $T_{BS}$ and while the storage magnetization direction remains unpinned. As a result of magnetic anisotropy, the storage magnetization direction rotates towards the magnetic anisotropy axis 300 and is retained in such an orientation once the magnetic tunnel junction 104 has cooled below the threshold temperature $T_{BS}$. In such manner, the storage magnetization direction is switched and retained along the magnetic anisotropy axis 300 in a "positive" direction.

Other implementations of write operations are contemplated. For example and referring back to FIG. 2, the bit line 108a can serve as a dual-function bit/field line to apply a write current to heat the magnetic tunnel junction 104 above the threshold temperature $T_{BS}$ as well as to induce a write magnetic field to switch the storage magnetization direction. Once the storage magnetization direction is switched according to the write magnetic field, current flow through the bit line 108a can be reduced or throttled down to a level sufficient to allow cooling of the magnetic tunnel junction 104 while maintaining the write magnetic field during such cooling. In such manner, the storage magnetization direction can be switched and retained along the magnetic field axis. Alternatively, current flow through the bit line 108a can be inhibited to deactivate the write magnetic field during cooling, such that the storage magnetization direction rotates towards the magnetic anisotropy axis. In such manner, the storage magnetization direction can be switched and retained along the magnetic anisotropy axis.

During a read operation of the MRAM cell 102a of FIG. 2, a degree of alignment between the storage magnetization direction and the reference magnetization direction is determined by applying a read current through the magnetic tunnel junction 104 via the bit line 108a, with the selection transistor 106 in a saturated mode. Measuring a resulting voltage across the magnetic tunnel junction 104 when the read current is applied yields a resistance value of the magnetic tunnel junction 104 for a particular degree of alignment. Alternatively, a resistance value can be determined by applying a voltage across the magnetic tunnel junction 104 and measuring a resulting current. When the respective magnetizations of the storage layer 200 and the reference layer 202 are antiparallel, a resistance value of the magnetic tunnel junction 104 typically corresponds to a maximum value, and, when the respective magnetizations are parallel, a resistance value of the magnetic tunnel junction 104 typically corresponds to a minimum value. When the respective magnetizations are between antiparallel and parallel, a resistance value of the magnetic tunnel junction 104 is typically between the maximum value and the minimum value.

Figure 5:
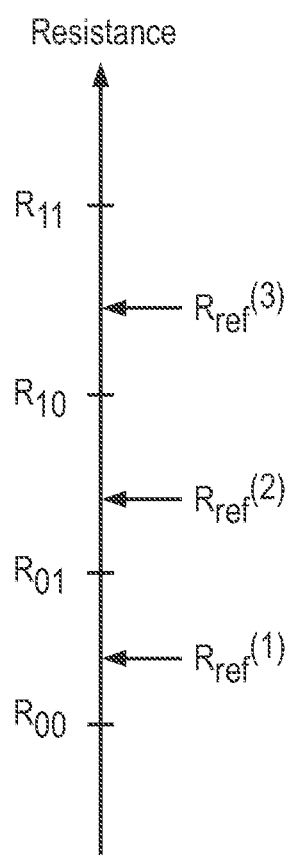
FIG. 5 illustrates a scale of resistance values corresponding to a write encoding scheme of FIG. 3A and FIG. 3B, according to an embodiment of the invention.

FIG. 5 illustrates a scale of resistance values corresponding to the write encoding scheme of FIG. 3A and FIG. 3B, according to an embodiment of the invention. Here, the reference magnetization direction is aligned along the magnetic field axis 306 in a "negative" direction, although other orientations of the reference magnetization direction are contemplated. When the storage magnetization direction is aligned according to the logic states "00", "01", "10", and "11", a resistance of the magnetic tunnel junction 104 takes on the values of $R_{00}$, $R_{01}$, $R_{10}$, and $R_{11}$, respectively, with $R_{00} < R_{01} < R_{10} < R_{11}$. A logic state of the MRAM cell 102a is read by comparing its resistance value to a set of reference resistance values $R_{ref}^{(1)}$, $R_{ref}^{(2)}$, and $R_{ref}^{(3)}$, with $R_{ref}^{(1)}$ representing an in-between resistance value between that of the logic states "00" and "01", $R_{ref}^{(2)}$ representing an in-between resistance value between that of the logic states "01" and "10", and $R_{ref}^{(3)}$ representing an in-between resistance value between that of the logic states "10" and "11". Processing of the resistance values can be carried out using a suitable controller in combination with, for example, a sample/hold circuit.

Figure 6:
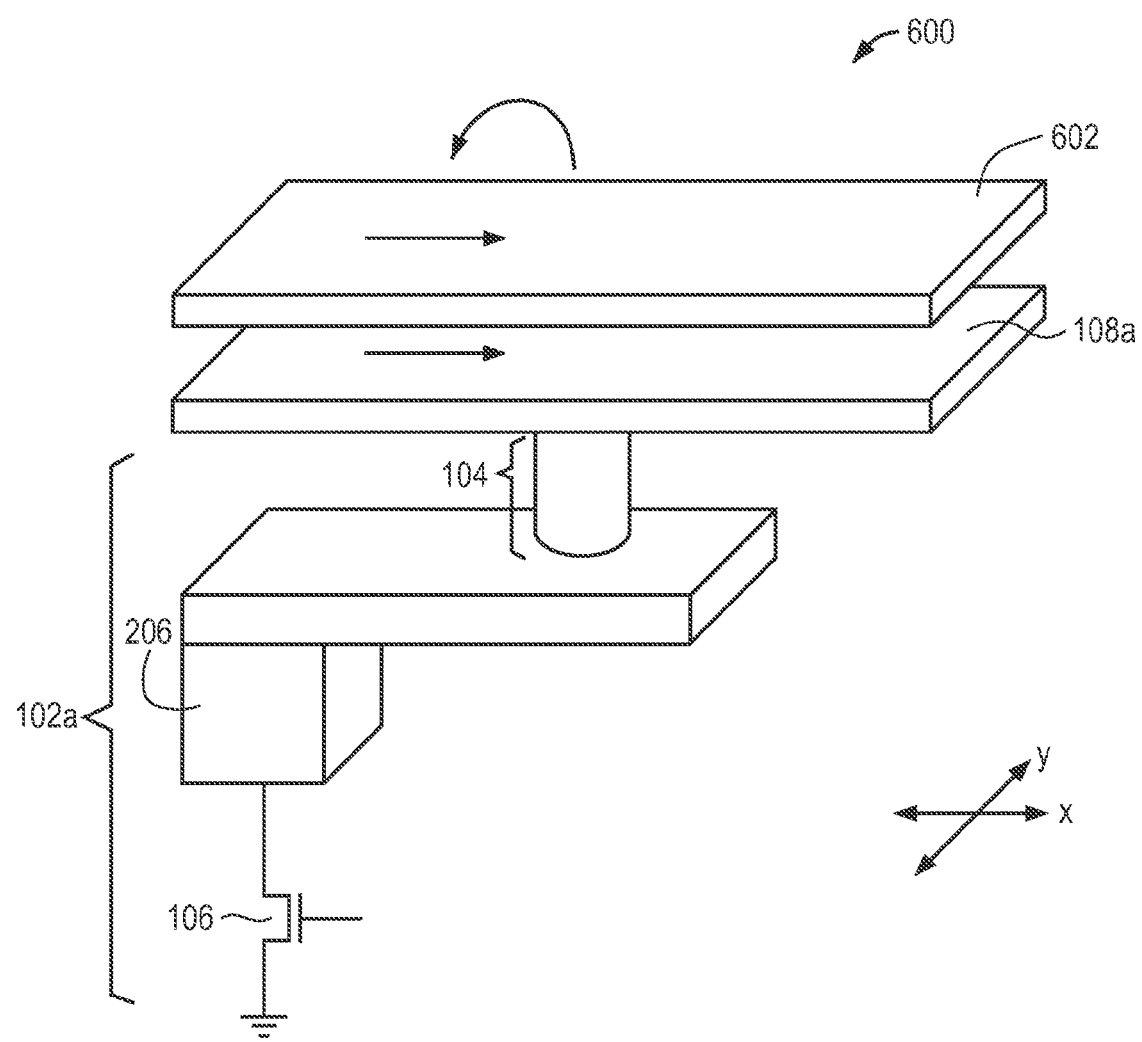
FIG. 6 illustrates a MRAM device implemented in accordance with another embodiment of the invention.

FIG. 6 illustrates a MRAM device 600 implemented in accordance with another embodiment of the invention. Certain aspects of the MRAM device 600 are implemented in a similar fashion as the MRAM device 100 explained with reference to FIG. 1 through FIG. 5, and those aspects are not repeated below. Referring to FIG. 6, the MRAM device 600 includes the bit line 108a, which is electrically coupled to the magnetic tunnel junction 104 and is dedicated for applying a heating current during writing and applying a read current during reading. In addition to the bit line 108a, the MRAM device 600 includes a field line 602, which is disposed above the bit line 108a and is substantially parallel relative to the bit line 108a. During a write operation, a write current is applied through the field line 602 to induce a write magnetic field to switch a storage magnetization direction accordingly. The orientation of the field line 602 and the bit line 108a can be varied from that illustrated in FIG. 6, such as in a substantially orthogonal orientation.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention.

Accordingly, unless specifically indicated herein, the order and grouping of the operations are not limitations of the invention.

What is claimed is:

1. A memory device comprising:
    at least one magnetic random access memory (MRAM) cell including
        a first magnetic layer having a first magnetization direction and a magnetic anisotropy axis;
        a second magnetic layer having a second magnetization direction; and
        a spacer layer disposed between the first magnetic layer and the second magnetic layer; and
    a field line magnetically coupled to the MRAM cell and configured to induce a write magnetic field along a magnetic field axis,
    wherein the magnetic anisotropy axis is tilted relative to the magnetic field axis, and
    wherein, during a write operation, the first magnetization direction is switchable between m directions to store data corresponding to one of m logic states, with m>2, at least one of the m directions is aligned relative to the magnetic anisotropy axis, and at least another one of the m directions is aligned relative to the magnetic field axis.

2. The memory device of claim 1, wherein m=4.

3. The memory device of claim 2, wherein the MRAM cell is a 2-bit cell.

4. The memory device of claim 1, wherein the magnetic anisotropy axis is tilted at an angle $\theta$ relative to the magnetic field axis, with $0° < \theta < 90°$.

5. The memory device of claim 4, wherein $35° < \theta < 55°$.

6. The memory device of claim 4, wherein the field line extends along a field line axis, and the magnetic anisotropy axis is tilted at an angle $(90° - \theta)$ relative to the field line axis.

7. The memory device of claim 1, wherein a cross-sectional shape of the first magnetic layer has an aspect ratio greater than 1.

8. The memory device of claim 7, wherein the cross-sectional shape has a longest dimension axis, and the magnetic anisotropy axis corresponds to the longest dimension axis.

9. The memory device of claim 1, wherein the MRAM cell further includes a pinning layer adjacent to the first magnetic layer, and the pinning layer is configured to stabilize the first magnetization direction relative to a threshold temperature.

10. The memory device of claim 9, further comprising a bit line electrically coupled to the MRAM cell, and wherein, during the write operation, the bit line is configured to apply a heating current to heat the MRAM cell above the threshold temperature, such that the first magnetization direction is temporarily unpinned prior to cooling of the MRAM cell below the threshold temperature.

11. The memory device of claim 10, wherein, prior to cooling of the MRAM cell below the threshold temperature, the field line is configured to maintain the write magnetic field, such that the first magnetization direction is aligned relative to the magnetic field axis.

12. The memory device of claim 10, wherein, prior to cooling of the MRAM cell below the threshold temperature, the field line is configured to induce the write magnetic field, such that the first magnetization direction is aligned relative to the magnetic field axis, and the field line is then deactivated, such that the first magnetization direction is aligned relative to the magnetic anisotropy axis.

13. The memory device of claim 10, wherein, during a read operation, the bit line is configured to apply a read current to determine a resistance of the MRAM cell, and the resistance is indicative of a degree of alignment between the first magnetization direction and the second magnetization direction.

14. The memory device of claim 9, wherein the field line is electrically coupled to the MRAM cell, and wherein, during the write operation, the field line is configured to apply a write current to induce the write magnetic field and to heat the MRAM cell above the threshold temperature, such that the first magnetization direction is temporarily unpinned prior to cooling of the MRAM cell below the threshold temperature.

15. The memory device of claim 14, wherein, prior to cooling of the MRAM cell below the threshold temperature, the field line is configured to maintain the write magnetic field, such that the first magnetization direction is aligned relative to the magnetic field axis.

16. The memory device of claim 14, wherein, prior to cooling of the MRAM cell below the threshold temperature, the field line is configured to induce the write magnetic field, such that the first magnetization direction is aligned relative to the magnetic field axis, and the field line is then deactivated, such that the first magnetization direction is aligned relative to the magnetic anisotropy axis.

17. The memory device of claim 14, wherein, during a read operation, the field line is configured to apply a read current to determine a resistance of the MRAM cell, and the resistance is indicative of a degree of alignment between the first magnetization direction and the second magnetization direction.

18. A method of operating a memory device, comprising:
    providing a magnetic random access memory (MRAM) cell having a storage magnetization direction and a magnetic anisotropy axis, wherein the storage magnetization direction is pinned relative to a threshold temperature;
    during a first write operation, heating the MRAM cell above the threshold temperature, such that the storage magnetization direction is temporarily unpinned prior to cooling of the MRAM cell below the threshold temperature; and
    during the first write operation and while the storage magnetization direction remains unpinned,
        inducing a first write magnetic field along a magnetic field axis, such that the storage magnetization direction is aligned relative to the magnetic field axis; and
        deactivating the first write magnetic field, such that the storage magnetization direction is aligned relative to the magnetic anisotropy axis, wherein the magnetic anisotropy axis is tilted at an angle $\theta$ relative to the magnetic field axis, with $0° < \theta < 90°$.

19. The method of claim 18, wherein $35° < \theta < 55°$.

20. The method of claim 18, further comprising:
    during a second write operation, heating the MRAM cell above the threshold temperature, such that the storage magnetization direction is temporarily unpinned prior to cooling of the MRAM cell below the threshold temperature; and
    during the second write operation, inducing a second write magnetic field along the magnetic field axis, such that the storage magnetization direction is aligned relative to the magnetic field axis, wherein the second write magnetic field is maintained prior to cooling of the MRAM cell below the threshold temperature.

* * * * *